United States Patent
Matsumoto et al.

(10) Patent No.: US 7,417,227 B2
(45) Date of Patent: Aug. 26, 2008

(54) SCANNING INTERFERENCE ELECTRON MICROSCOPE

(75) Inventors: Takao Matsumoto, Moroyama (JP); Masanari Koguchi, Kunitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 163 days.

(21) Appl. No.: 11/294,470

(22) Filed: Dec. 6, 2005

(65) Prior Publication Data
US 2006/0124850 A1 Jun. 15, 2006

(30) Foreign Application Priority Data
Dec. 10, 2004 (JP) .............................. 2004-357539

(51) Int. Cl.
*G01N 23/00* (2006.01)
*G21K 7/00* (2006.01)
(52) U.S. Cl. .................. 250/311; 250/492.1; 250/306; 257/14; 257/10; 257/9; 257/28; 257/30; 438/3; 438/105
(58) Field of Classification Search .............. 250/492.1, 250/311, 306; 257/14, 10, 9, 28, 30; 438/3, 438/105
See application file for complete search history.

(56) References Cited

U.S. PATENT DOCUMENTS 5,004,918 A * 4/1991 Tsuno et al. ................. 250/311
6,163,321 A * 12/2000 Kiyokawa .................... 345/589
6,759,656 B2 * 7/2004 Tomita ........................ 250/311

FOREIGN PATENT DOCUMENTS

JP 8-45465 8/1994
JP 9-134697 11/1995

OTHER PUBLICATIONS

Tanji, T., Ru Q., Tonomura, A., "Differential microscopy by conventional electron off-axis holography", Appl. Phys. Lett. 69, 18, 1996.*
Th. Leuthner et al., "STEM—Holography Using the Electron Biprism", Phys. Stat. Sol. (a) 116, 113 (1989), pp. 113-121.

* cited by examiner

*Primary Examiner*—Nikita Wells
*Assistant Examiner*—Meenakshi S Sahu
(74) *Attorney, Agent, or Firm*—Reed Smith LLP; Stanley P. Fisher, Esq.; Juan Carlos A. Marquez, Esq.

(57) ABSTRACT

The conventional detection technique has the following problems in detecting interference fringes: (1) Setting and adjustment are complex and difficult to conduct; (2) A phase image and an amplitude image cannot be displayed simultaneously; and (3) Detection efficiency of electron beams is low. The invention provides a scanning interference electron microscope which is improved in detection efficiency of electron beam interference fringes, and enables the user to observe electric and magnetic information easily in a micro domain of a specimen as a scan image of a high S/N ratio under optimum conditions.

16 Claims, 9 Drawing Sheets

OPTICAL MICROSCOPE IMAGE;
PIXEL SIZE=0.36 μm

SCANNING INTERFERENCE ELECTRON MICROSCOPE

CLAIM OF PRIORITY

The present invention claims priority from Japanese application JP 2004-357539 filed on Dec. 10, 2004, the content of which is hereby incorporated by reference on to this application.

FIELD OF THE INVENTION

The present invention relates to an electron beam apparatus, such as an electron microscope, which measures an electromagnetic field in a matter or vacuum using interference of electron beams.

BACKGROUND OF THE INVENTION

The electron holography, or the electron interference microscopy, is a technique of quantitatively measuring an electromagnetic field in a matter or vacuum by measuring a phase shift of an electron beam caused by a specimen, and specifically a technique in which an electron beam generated in an electron source is splitted into a plurality of electron beams by an electron biprism, a splitted electron beam is made to enter the specimen, and the electron beam having transmitted through the specimen is detected, whereby an interference image is acquired. Such a scanning interference electron microscope is disclosed in, for example, Japanese Patent Application Laid-Open No. 8-45465 and Japanese Patent Application Laid-Open No. 9-134687.

The electron beam holography method is classified in terms of its system into an interference electron microscopy of the scanning transmission electron microscope (STEM; Scanning Transmission Electron Microscope) type and an interference electron microscopy of the transmission electron microscope (TEM; TranSmission Electron Microscope) type. The interference electron microscopy of the STEM type has the following merits as compared with the interference electron microscopy of the TEM type: (1) The STEM type interference electron microscopy can display a phase image on-line and real-time; (2) It can display simultaneously an analytical image, such as detection of a characteristic X-ray etc. generated by scanning illumination of an electron beam, and an interference image; and (3) Since a spatial resolution is determined by a spot size of a focused electron beam, controllability of spatial resolution is excellent; and the like.

An electromagnetic field in the specimen can be estimated by measuring the amount of phase shift of interference fringes by image analysis of a detected interference image, namely the amount of positional shift between positions of constructive interference and of destructive interference. As a technique of measuring the amount of phase shift of interference fringes, for example, there is the method of Leuthner et al. In addition, in the invention disclosed in Japanese Patent Application Laid-Open No. 9-134687, the amount of phase shift is calculated with the method of Leuthner et al. In the Leuthner' method (Th. Leuthner, H. Lichte, and K-H. Herrmann: "STEM-Holography Using the Electron Biprism" Phys. Stat. Sol. A 116, 113. (1989)), a phase image of the specimen is acquired by detecting an electron beam having passed through a grating-type slit with an electron beam intensity detector, and converting an intensity signal of the detected electron beam into phase information. Hereafter, the Leuthner's method will be explained in detail using FIG. 2A and FIG. 2B.

Figure 2A:
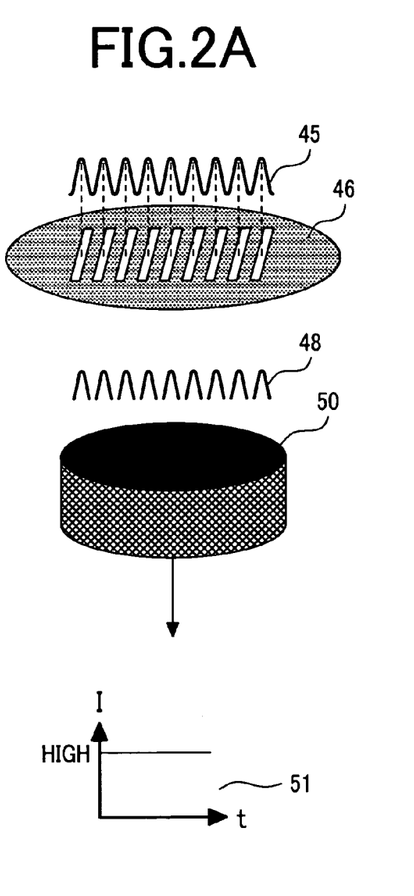
FIG. 2A corresponds to a case where an aperture of the slit coincides with a position of constructive interference.
Figure 2B:
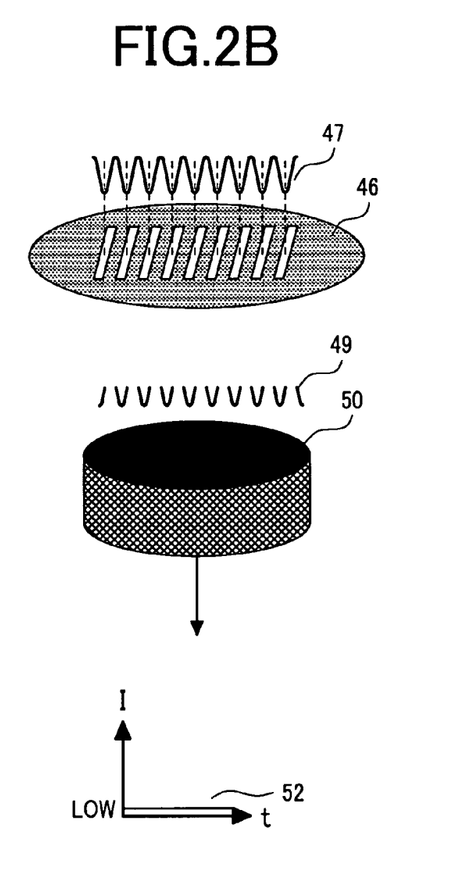
FIG. 2B corresponds to a case where the aperture of the slit coincides with a position of destructive interference.

FIGS. 2A and 2B are schematic diagrams each showing a comparative relation among interference fringes of electron beams, a slit, and an electron beam intensity detector. In FIGS. 2A and 2B, the reference numeral 46 denotes a slit and 50 denotes an electron beam intensity detector. The numerals 48 and 49 each denote interference fringes of the electron beams which reach the slit. FIG. 2A corresponds to a case where an aperture of the slit coincides with a position of constructive interference and FIG. 2B corresponds to a case where the aperture of the slit coincides with a position of destructive interference. The vertical axis of the interference fringes 48 and 49 corresponds to the intensity of the electron beams. When performing the method of Leuthner et al., first a direction of the interference fringes and a direction of the slit are set in the same direction. Usually, the apparatus user observes the image of interference fringes by visual inspection, and manually adjusts the direction of the interference fringes obtained, the direction of the slit apertures, and a position of the grating-type slit itself.

When the interference fringes are detected in a state where the direction of the interference fringes agrees with the direction of the slit, the intensity of the detected electron beam varies depending on positions of constructive interference and of destructive interference relative to the slit. In the case of FIG. 2A, the amount of the electron beams passing through the slit 46 becomes a maximum, and in the case of FIG. 2B, the amount of the electron beams passing through the slit 46 becomes a minimum. Therefore, if the amount of the electron beams detected with the detector 50 is normalized using its maximum and minimum, the amount of the detected electron beams could be converted to a cosine of the amount of phase shift. That is, when the amount of the electron beams of the interference fringes passing through the slit 46 assumes a maximum, the phase shift by the specimen is $0\}2\pi\Delta n$, and when the amount of the electron beams of the interference fringes passing through the slit 46 assumes a minimum, the phase shift by the specimen is $\pi\}2\Delta n$. Generally, a direction of the apertures of the slit 46 and a position of the slit 46 are so adjusted that detected constructive interference and destructive interference assume detection intensities of those formed under the condition that there is no specimen or both of the splitted electron beams pass through a vacuum. Therefore, it becomes possible to display an image having phase information of the specimen by displaying the amount of the electron beams having passed through the slit 46 which is normalized to be a value between a maximum and a minimum as a cosine of the amount of phase shift or further converting the value so obtained into the amount of phase shift between zero and $\pi$.

SUMMARY OF THE INVENTION

An S/N ratio of a scanning phase information image obtained with the scanning interference electron microscope becomes higher with increasing intensity of the detected electron beam intensity. Therefore, it is essential to make the electron interference fringes enter a detector effectively in order to achieve a clear scan image. The conventional scanning interference electron microscope using the method of Leuthner et al. has the following problems.

(1) Setting and adjustment are complex and difficult to do.
(2) Simultaneous display of a phase image and an amplitude image cannot be performed.
(3) The detection efficiency of the electron beams is low.

The above (1) problem arises from a fact that a relative direction between the slit and the interference fringes and positions thereof are adjusted manually. Specifically, adjustment to equalize a spacing of apertures of the slit and a spacing of interference fringes and make directions of both spacings agree with each other is done by observing the interference fringes magnified by about 1000 times with imaging lenses with an eye using a fluorescent screen and moving the position and direction of the slit manually. Since the magnification weakens the intensity of interference fringes, the adjustment requires skills and experience and accurate adjustment is difficult.

Regarding a problem described in the above (2), since only one detector is used, it is essential to select and display either the amplitude image corresponding to a normal electron microscope image or the phase image, thus simultaneous display being impossible. If the observer is enabled to observe simultaneously structure information obtained from the normal electron microscope image and electromagnetic field information obtained from the phase image, it will give the observer an extra convenience.

The above (3) results from a fact that, since electron beams passing through the slit are allowed to enter the detector, a part of the electron beam blocked by the slit is not used. Since the electron beams blocked the slit cannot be used effectively, there is a limit in improving detection sensitivity or detection precision. Although it is possible to capture the whole image of the interference fringes, namely, to detect all the electrons, and process them with a high-speed processor, a time to transfer data to the processor, a time required for arithmetic computing, a time to transfer the data to memory, etc. will become huge, which deprives the STEM type interference electron microscopy of its advantage that a phase image can be displayed real-time. The present invention has its object to provide a scanning interference electron microscope which is easy to set up and adjust and yet highly sensitive.

The present invention solves the above-mentioned problems by detecting interference fringes of electron beam with an electron beam detector that consists of one pair of multi pixels. That is, an output of this detector is a 1-dimensional interference fringe image such that a value of each pixel is an integration value of 2-dimensional pixels along one 1-dimensional direction. Moreover, in the present invention, by mounting this detector on an externally controllable rotationable stage, a magnification of the interference fringes and a rotation direction of the detector are automatically adjusted, so that the interference fringes can be detected under conditions of highest efficiency.

According to the present invention, the apparatus can detect interference fringes of the electron beams with an asymmetric 2-dimensional detector with integration capability, and adjust them at high-speed and easily, thereby being able to detect them under optimum conditions. Therefore, a scan image of a high S/N ratio can be obtained. Moreover, the use of one pair of detectors enables simultaneous display of the amplitude image and the phase image. Furthermore, unlike the conventional microscopes, this microscope uses no slit, and accordingly the whole electrons constituting the interference fringes can be used, achieving high detection efficiency.

BRIEF DESCRIPTION OF THE DRAWINGS

FIGS. 2A and 2B are diagrams explaining a detection technique that is being carried out conventionally.

DETAILED DESCRIPTION OF THE PREFERRED EMBODIMENTS

First Embodiment

Figure 1:
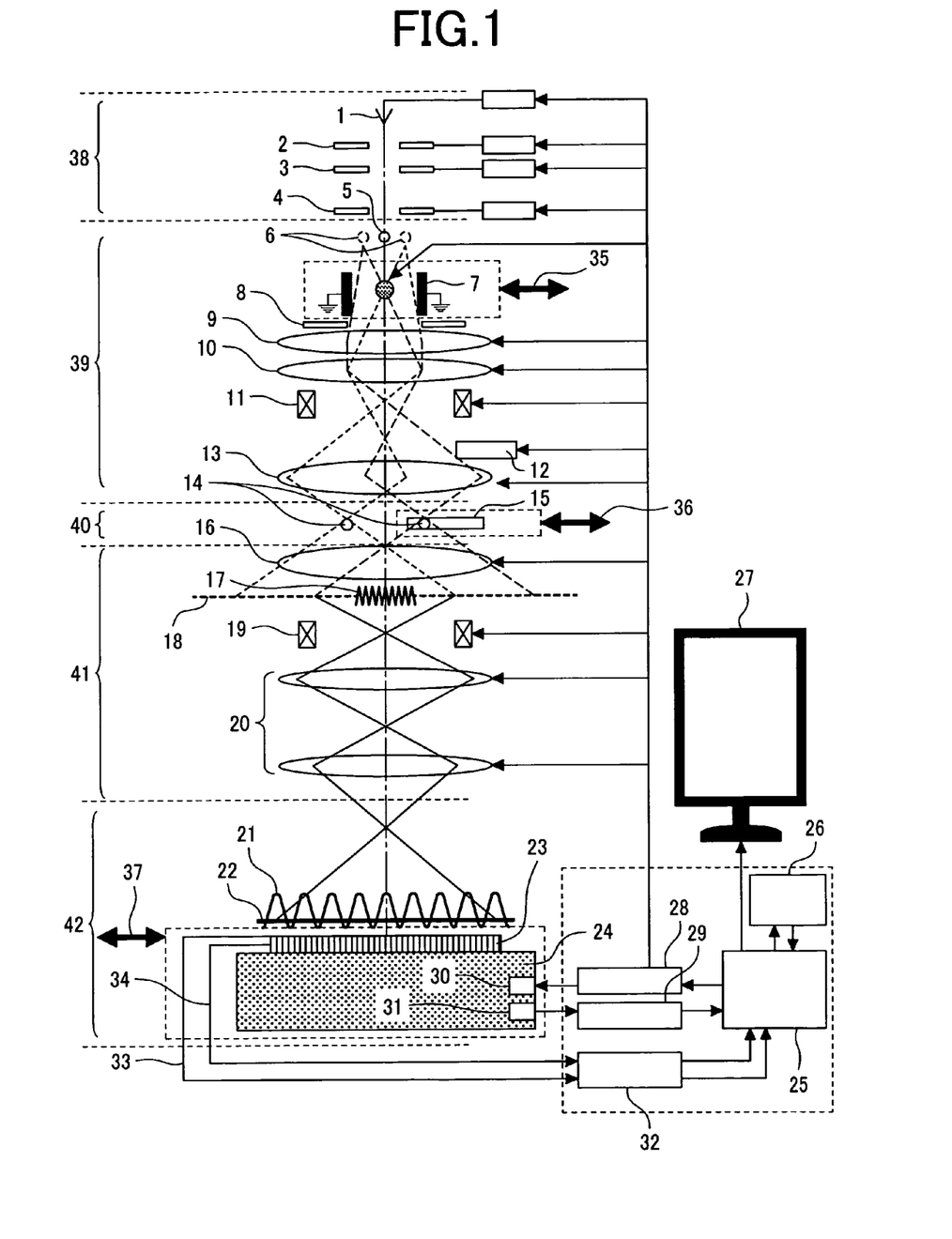
FIG. 1 is a diagram explaining a method of carrying out the present invention.

In this embodiment, an example where the present invention is applied to STEM will be described. FIG. 1 shows an example of a configuration of an STEM of this embodiment. The STEM of this embodiment comprises an electron gun 38, an illumination system 39, a specimen chamber 40, an imaging system 41, a detection system 42, a control system, etc., as a rough breakdown of the STEM.

The electron gun 38 of the STEM of this embodiment consists of an electron source 1, a first anode 2, a second anode 3, an acceleration anode 4, etc. The illumination system 39 consists of an electron biprism 7, a condenser aperture 8, a first condenser lens 19, a second condenser lens 10, a scanning coil 11, an objective lens pre-field 13, an objective lens post-field 16, etc. In addition, although not illustrated specifically, the electron biprism 7 is equipped with an electron biprism fine positioning system 35, and is made movable by this. The imaging system 41 and the detection system 42 consist of a secondary electron detector 12, the stigmator 19, single or multiple imaging lenses 20, a detector 23, a rotationable stage 24, a rotation mechanism 37 of the rotationable stage, etc. In addition to the secondary electron detector 12, the STEM may be equipped with a reflected electron detector.

The control system consists of a CPU 25, memory 26, a display 27, D/A converters 28, 29, a signal processor 32, etc. The D/A converter 28 is connected with constituents of the electron optical system and the imaging system through signal transmission line, and a control signal from the CPU 25 is transferred to each constituent through the signal transmission line. Moreover, although not illustrated in the figure, the display 27 is equipped with information input means, such as a keyboard and a mouse, and the system user enters desired information into the system using the information input means as an input interface. There is a case where the CPU 25, the D/A converter 28, and the signal processor 32 may be housed in a single enclosure, each as a part of a control computer. The reference numerals 30 and 31 denote a specimen stage fine positioning system and a specimen stage fine positioning sensor, both of which are attached to the rotationable stage 24. The numeral 37 denotes the rotation mechanism of the rotationable stage for moving the detector 23 and the rotationable stage 24 used in the present invention and replacing the detector 23 to another detector. The numeral 15 denotes a specimen stage, which is movable in an X-Y plane and in a Z-direction by stage drive means indicated by an arrow.

First, operations of the electron optical system will be explained. The electron biprism 7 is inserted between the electron source 1 and a first condenser lens 9 and a voltage is applied to this, whereby the electron beam is splitted into two which apparently come from two virtual electron sources 6. The two splitted electron beams are focused with the first condenser lens 9, a second condenser lens 10, and further the objective lens pre-field 13, respectively, to form two micro spots 14 on a plane of a specimen 15. At this time, the two beams are so adjusted that one of the two micro spots transmits through the specimen and the other passes through a vacuum in proximity to the specimen. Note here that a distance of separation of the two micro spots becomes larger in proportion to a voltage applied to the electron biprism 7.

In this embodiment, the voltage applied to the electron biprism 7 and the voltage applied to an electron beam deflection coil 11 are gang controlled in response to a magnification of an image to be observed. Although this gang control is automatically done by the CPU 25, naturally the both voltages can be set manually. This gang control is realized by setting up the voltage of the electron biprism in such a way that the distance of separation of the two micro spots on the plane of the specimen which is calculated with both a deflection angle of the electron beam by the electron biprism and the electron optical system assumes either a comparative value of the spot size of the focused electron beam in each magnification power multiplied by a predetermined multiplier or an absolute value in proportion to an inverse of each magnification value.

Now, the electron beam having transmitted through the specimen and the electron beam passing though a vacuum overlap on an arbitrary plane below the specimen to generate interference fringes 17, which is magnified with the imaging lenses 20. The magnified interference fringes are recorded by the detector 23 disposed on an observation plane 22. Generally, if the electron beam is scanned with the electron beam deflection coil 11, the whole interference fringes will move. However, if the object plane of the imaging lenses 20 is adjusted to be on a pivot plane 18 of the electron beam, the interference fringes will not move even with electron beam scanning. Here, the "pivot plane" means an electron optics plane that remains immovable even when the electron beam is scanned at a fulcrum of deflection of the electron beam.

Here, the imaging lenses 20 may be of one stage or a combination of multi-stage lenses according to resolution of the detector. In this embodiment, the detector 23 is placed on the externally controllable rotationable stage 24. Moreover, the electron biprism 7, the detector 23, and the rotationable stage 24 can be removed from the passage of the electron beam with the help of the fine positioning system 35 and the rotationable stage movement mechanism 37, respectively, so that these components do not hinder operations of the system as a normal scanning transmission electron microscope. Naturally, this microscope can also be used as a special purpose apparatus of the scanning interference electron microscope. Furthermore, the use of the stigmator 19 consisting of a multipole is desirable because an image of the interference fringes is compressed in a direction parallel to the interference fringes and the intensity of the electron beams is enhanced.

Figure 3:
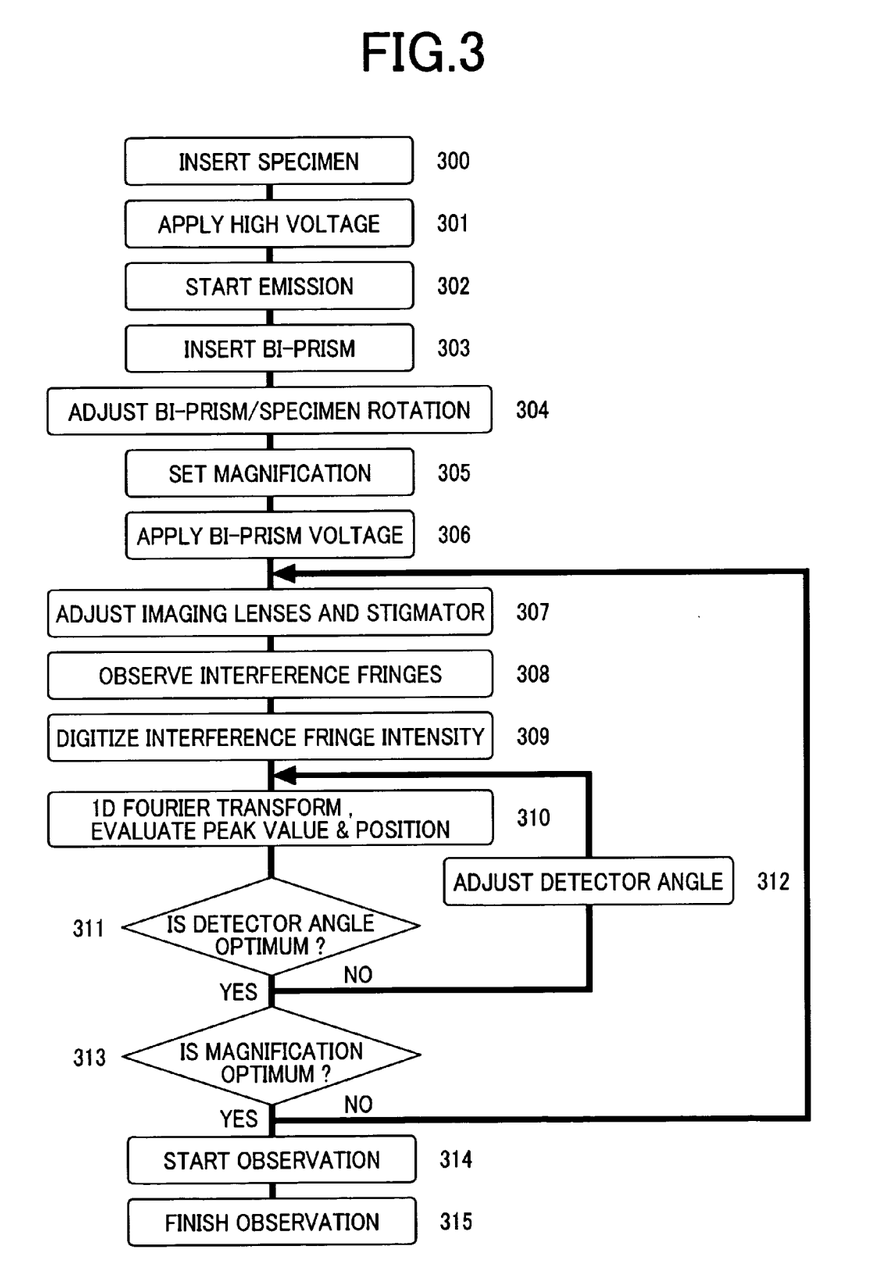
FIG. 3 is a flowchart explaining procedures of optimally adjusting the direction of interference fringes and the direction of a detector in the present invention.

Next, a method for observing the interference fringes by using the STEM shown in FIG. 1 will be explained using FIG. 3. First, in Step 300, the specimen is placed and held on the specimen stage 15 and carried into the vacuum chamber. Next, in Step 301, a predetermined voltage is applied to the acceleration anode 4 to accelerate the electron beam generated in the electron source 1. In Step 302, field emission current is pulled out by applying suitable voltages to the first anode 2 and the second anode 3.

In Step 303, the electron biprism fine positioning system 35 is driven to move the electron biprism 7 to a predetermined position. In Step 304, the electron biprism is adjusted by using a rotational mechanism of the electron biprism and a rotational mechanism of the specimen so that the edge of the specimen becomes parallel to the direction of the electron biprism.

In Step 305, the monitor 27 shows a screen used to specify observation magnification, and the apparatus user enters the observation magnification into the apparatus by input means, such as a GUI and a keyboard. The CPU 25 determines a voltage to be applied to the biprism and transfers it to the electron biprism 7 based on the entered observation magnification. The applied voltage determined by the CPU 25 is converted into an analog control signal by the D/A converter 28, and inputted into an unillustrated drive power supply for the electron biprism. Then, Step 306 is executed.

Next, in Step 307, adjustment of the magnifying lens and the stigmator 19 is executed. That is, the magnification of the imaging lens 20 is suitably adjusted, the interference fringes 17 on the pivot plane 18 are converted into interference fringes 21 suitably magnified, and further these interference fringes 21 are compressed in a direction parallel to the fringes by adjusting the stigmator 19.

In Step 308, formation of the interference fringes 21 is completed in this way, and in Step 309, the interference fringes 21 are grabbed by the apparatus through the detector 23. Since the present invention uses one pair of detectors, what is inputted into the apparatus is a 1-dimensional image 33 or a 1-dimensional image 34. In Step 310, the inputted interference-fringes image is 1-dimensional-Fourier transformed by the processor 32. From the results, the CPU 25 finds a current rotational speed and a peak position of the rotationable stage 24, namely, a spatial frequency giving a peak and a peak intensity, and stores them in the storage device 26. The rotation angle of the rotationable stage 24 is obtained by inputting an output of the specimen stage fine positioning sensor 31 provided in the rotationable stage 24 into the CPU 25 through the A/D converter 29.

In Step 311, whether or not the current rotation angle of the rotationable stage 24 is optimum is evaluated. That is, peak intensities corresponding to the respective rotation angles which cover up to 180 degrees are called from the storage device 26, and whether or not a peak intensity corresponding to the current rotation angle is a maximum among them is evaluated. If data corresponding to rotation angles which cover up to 180 degrees is not obtained or if the current rotation angle is not optimum, the flow proceeds to Step 312, where the rotation angle is varied by a previously set angle. This operation is done by the CPU 25 by inputting a signal to the specimen stage fine positioning system 30 provided in the rotationable stage 24 through the D/A converter 28. Here, the flow returns to Step 310 again, and Step 311 and Step 312 are repeated until the rotation angle becomes optimum.

If the rotation angle of the detector is determined optimum, whether or not the magnification is optimum is determined in Step 313. That is, the peak positions stored in Step 310 are scanned over a range of previously set spatial frequencies, and whether or not the peak position gives a maximum peak intensity among them is evaluated. If either of the two criteria is not satisfied, the flow goes back to Step 307, where the magnification of the magnifying lens is varied by a previously set value, and Steps 308 to 313 are repeated.

Figure 4:
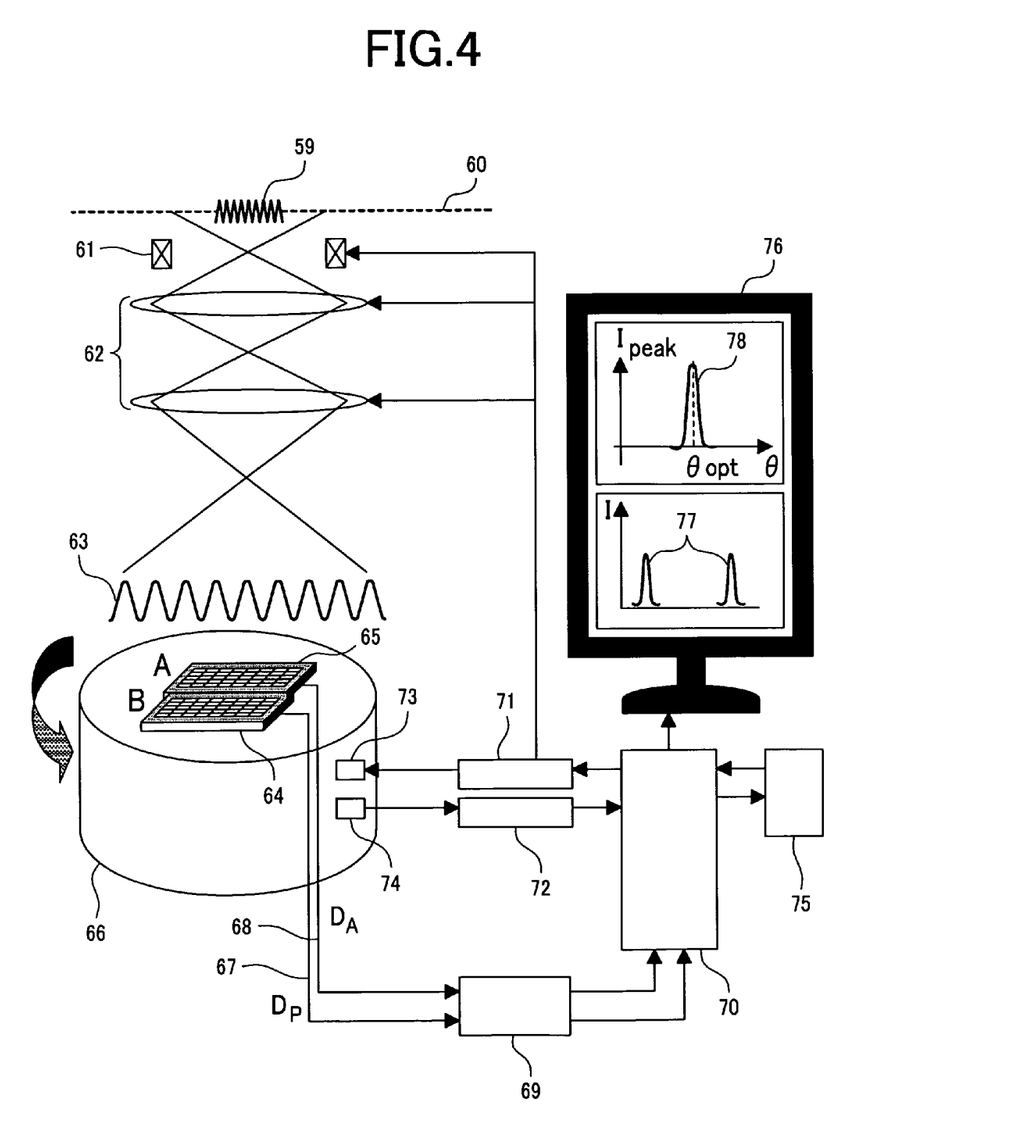
FIG. 4 explains procedures of optimally adjusting the direction of interference fringes and the direction of a detector in the present invention.

If it is determined that the magnification is optimum in Step 313, the flow proceeds to Step 314, where the specimen is observed and the observation is finished in Step 315. FIG. 4 is a diagram showing the imaging system and a main part of the control system of the STEM of FIG. 1, and the operation flow shown in FIG. 3 is executed by constituents shown in FIG. 4. In FIG. 4, the drawing-out reference numeral 63 denotes interference fringes of the electron beam that passes through imaging lenses 62 and reaches a rotationable stage 66. On the rotationable stage 66, one pair of asymmetric 2-dimensional detectors with integration capability 64, 65 are placed and held. Here the "asymmetric 2-dimensional detector with integration capability" means a detector which is made up of a 2-dimensional array of multi-pixels such that a ratio of the number of pixels in one dimension and the number of pixels in the other dimension is equal to or more than two and a value obtained by integrating values of pixels along a dimension having a smaller number of pixels is outputted as a value of each pixel being arrayed along the dimension having a larger number of pixels. This function may be realized with hardware or may be realized with software.

The asymmetric 2-dimensional detectors with integration capability 64, 65 are each made up of a large number of electron sensing elements, wherein signals detected by the elements are integrated in a direction along a direction of integration sequentially and is outputted finally as a 1-dimensional image. In this embodiment, the output signal from the asymmetric 2-dimensional detector with integration capability 64 and the output signal from the asymmetric 2-dimensional detector with integration capability 65 are intended to be used for phase detection and for amplitude detection, respectively, and they are designated by symbols P and A in the figure, respectively.

The asymmetric 2-dimensional detectors with integration capability 64, 65 are connected with signal transmission lines 67, 68, respectively, being connected to a signal processor 69. A signal which transmits through the transmission line 67 is a signal for phase detection and a signal which transmits through the transmission line 68 is a signal for amplitude detection, and they are designated by DP and DA in FIG. 4, respectively. The signal passing through the signal processor 69 is finally inputted into a CPU 70, subjected to a predetermined operational processing, and subsequently displayed by display means 76. A D/A converter 71 is provided in order to convert the rotation angle information of the rotationable stage 66 from the CPU 70 into an analog control signal and transfer it to a fine rotation mechanism 73 for the rotationable stage 66, and also serves for a stigmator 61 and the imaging lenses 62. An A/D converter 72 is provided in order to convert a signal from a sensor 74 for detecting rotation of the rotationable stage into digital data which the CPU 70 can process.

Next, a position adjustment flow of the detector will be explained in detail. Prior to observation of the specimen, it is necessary to form interference fringes first on the detector placed in the center of this scanning interference microscope, i.e., on the electron optical axis. This can be done by mechanical adjustment of the imaging lenses and adjustment of the electron beam deflection coil built in the illumination system. After this was completed, it is necessary to adjust the detector so that the interference fringes may be formed along a longitudinal direction of the detector used in the present invention. (It is necessary to adjust relatively a direction of the interference fringes and a direction of the asymmetric 2-dimensional detector with integration capability.) Here, the direction of the interference fringes of the electron beams and the direction of the detector are defined as follows. That is, the interference fringes of the electron beams are of a pattern in which an intense part and a weak part of the intensity of the electron beams are repeated in a 1-dimensionally direction in a sinusoidal manner. The 1-dimension direction in concern is defined as a direction of the interference fringes. The direction of the asymmetric 2-dimensional detector with integration capability is defined as its longitudinal direction. Adjusting the direction of the interference fringes and the direction of the detector thus defined can be achieved precisely by performing procedures as described below. These procedures will be explained using FIG. 4 similarly.

First, the interference fringes 63 are made to be incident on the detector 64 and the detector 65, under appropriate conditions. The 1-dimensional image signal DA 67 which is an output of the phase detecting detector 64 or the 1-dimensional image signal DP 68 which is an output of the amplitude detecting detector 65 is subjected to 1-dimensional fast Fourier transform, namely converted to a spatial frequency spectrum, by the signal processor 69. When the spectrum is displayed on the display 76, if the direction of the interference fringes and the direction of the detector agree with each other, a clear peak 77 is observed in the spectrum. The signal processor 69 may be realized with hardware using a special board, or may be realized by executing software of Fourier transform on the CPU 70.

In line with this, rotational angle detection means, such as the angle sensor 74, is provided in the rotationable stage 66, and a rotational angle of the rotationable stage 66 counting from the start of rotation is outputted as an angle signal, which is inputted into the CPU 70 though the A/D converter 72. The CPU 70 displays a phase signal inputted from the signal converter 69 on the display means 76 in synchronization with the angle signal from the A/D converter 72. Then, data showing a dependence of the peak intensity of the spectrum on the rotational angle of the rotationable stage, as shown in a graph 78, on the display means 76. Observing the height of the peak while rotating the detector, the peak intensity assumes a maximum when the angle of the rotation agrees with a best matched direction. The angles at which the peak intensity becomes maximums are determined as optimum arrangement angles of the asymmetric 2-dimensional detectors with integration capability 64, 65, respectively. Determination of the optimum arrangement angle may be selected by the apparatus user, or the apparatus may control adjustment of rotation angle so that the optimum peak is automatically selected.

In the case where the apparatus user itself selects the optimum peak, the apparatus is so controlled that, when rotation of the rotationable stage is ended in a range of horizontal direction of the graph 78, the apparatus becomes a state of waiting an entry from the user. When the apparatus becomes the state of waiting an entry, the apparatus allows the apparatus user to select a peak which is considered optimum from the graph 78 displayed on the display screen 76 with input means, such as a mouse and as key board, entering information of the optimum peak into the apparatus. The information of the optimum peak entered by the apparatus user is transferred to the CPU 70, and the CPU 70 reads a rotation angle of the optimum peak from the display image (graph 78) based on the inputted information and forwards the information of the optimum angle to the D/A converter 71. The optimum angle is fed back to the fine rotation mechanism 73 installed in the rotationable stage 66. The control means of the rotationable stage rotates the rotationable stage based on the angle information fed back thereto, and optimizes the arrangement angle of the asymmetric 2-dimensional detectors with integration capability 64, 65.

In the case where the apparatus optimizes the arrangement angle of the asymmetric 2-dimensional detectors with integration capability in a fully automatic manner, the CPU 70 automatically reads an optimum peak from the graph 78 and feeds it back to the fine rotation mechanism 73 for the rotationable stage through the D/A converter 71. In this case, it is not necessary to control the apparatus to be in the state of waiting for the user's entry after the end of the rotation of the rotationable stage; automatic reading of the optimum peak may be started just after the end of the rotation. It is needless to say that the apparatus needs to be adjusted in advance so that the center of the detector coincides with the center of the interference fringes before the adjustment of the optimum arrangement angle of the interference fringes described above.

Note here that, since the interference fringes are integrated in a direction parallel to the interference fringes in the case of the asymmetric 2-dimensional detector with integration capability used in this embodiment, a clear peak can be obtained only when the direction of the interference fringes agrees with the direction of the detector in a highly precise manner; therefore, the direction of the two can be adjusted precisely. Moreover, integration of the interference fringes enhances the ratio excellently, and consequently the directions can be adjusted further accurately. By such procedures, it becomes possible to bring the direction of the interference fringes and the direction of the detector into agreement with each other with high precision.

Figure 5:
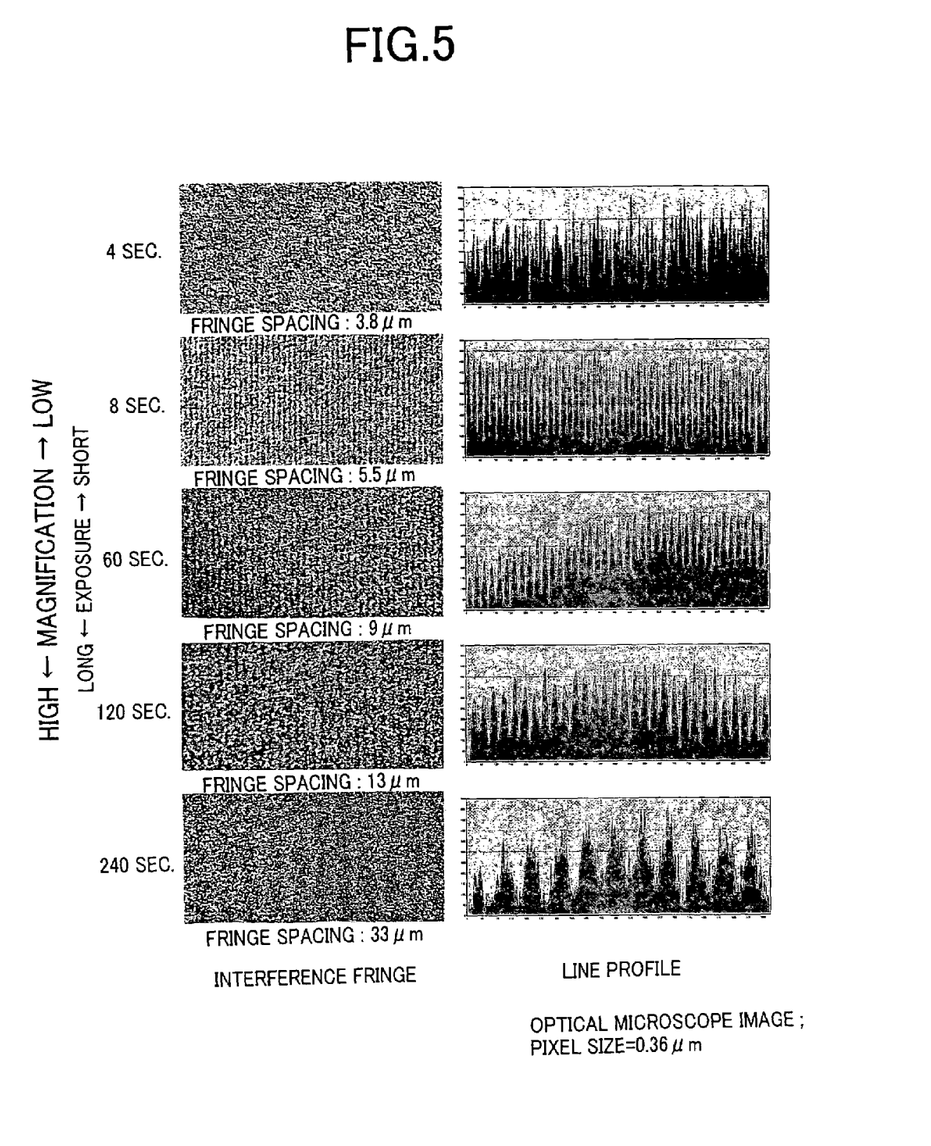
FIG. 5 is a diagram explaining variation of spacing and contrast of interference fringes with magnification.

A next important adjustment subject is adjustment between a fringe spacing of the interference fringes, or a magnification of the interference fringes, and a pixel size of the detector. FIG. 5 shows several electron interference fringes formed under fixed conditions recorded on a high-resolution film while varying only the magnification. A film whose resolution allows interference fringes having a fringe spacing of about 3 µm at a minimum to be recorded was used. When the magnification is so reduced that the interference fringe spacing becomes 33 µm, 13 µm, 9 µm, 5.5 µm, and 3.8 µm on the film, an exposure time necessary to achieve the same optical density becomes smaller as 240 sec, 120 sec, 60 sec, 8 sec, and 4 sec, respectively. Observing a profile (FIG. 5, right row) obtained by integrating the interference fringes recorded under these conditions in a direction parallel to the fringe of the interference fringes, it is found that a highest contrast is achieved with an interference fringe spacing of 5.5 µm and an exposure time of 8 sec. As shown in this example, it is preferable to record the interference fringes with as small a magnification as possible. However, when the interference fringe spacing comes close to a resolution limit of a detector (in this case, the film), the contrast blurs because constructive interference and destructive interference cannot be recorded.

The above fact teaches that in order to detect the interference fringes, it is recommended to magnify the interference fringes so as to have a best fringe spacing which complies with the resolution of the detector. So, in this embodiment, the magnifying lens 62 and the stigmator 61 are controlled by the CPU 70 and the D/A converter 71, as shown in FIG. 4, and a position and the height of the peak in the 1-dimensional Fourier conversion of the interference fringes are adjusted by the same procedures as was used in adjusting a direction of the detector. The adjustment is done by the following procedures.

First, the magnifying lens 62 is so adjusted that the electron beam is incident on the center of the detector under a condition that the spacing of the interference fringes 63 is sufficiently large as compared to a size of a pixel of the detector 64 or detector 65. Then, the stigmator 61 is so adjusted that the interference fringes are compressed in a direction parallel to the interference fringes. After that, the direction of the detectors is optimized with respect to the direction of the interference fringes by the procedures described above. At this time, a peak value in a spatial frequency spectrum of the interference fringes under the optimum conditions is stored in a storage device 75. Next, the magnification of the magnifying lens 62 is made small, the same procedures are repeated, and a peak in the spectrum corresponding to a current value of the magnifying lens 62 is stored sequentially. Subsequently, the current value of the magnifying lens 62 is plotted on the horizontal axis and the peak value in the spectrum is plotted on the vertical axis. Since the peak value in the spectrum becomes a maximum at an optimum magnification of the magnifying lens 62, the magnifying lens 62 and the stigmator 61 are set to this condition and the adjustment is finished.

By the above procedures, the interference fringes can be detected under the optimum conditions. Naturally, these adjustment procedures can be put in a program and be performed automatically. It goes without saying that the procedures of matching the direction of the interference fringes described above can be realized by finely tuning a mechanism for rotating the electron biprism in a plane vertical to the direction of the electron beam, except for the rotation of the detector.

Figure 6:
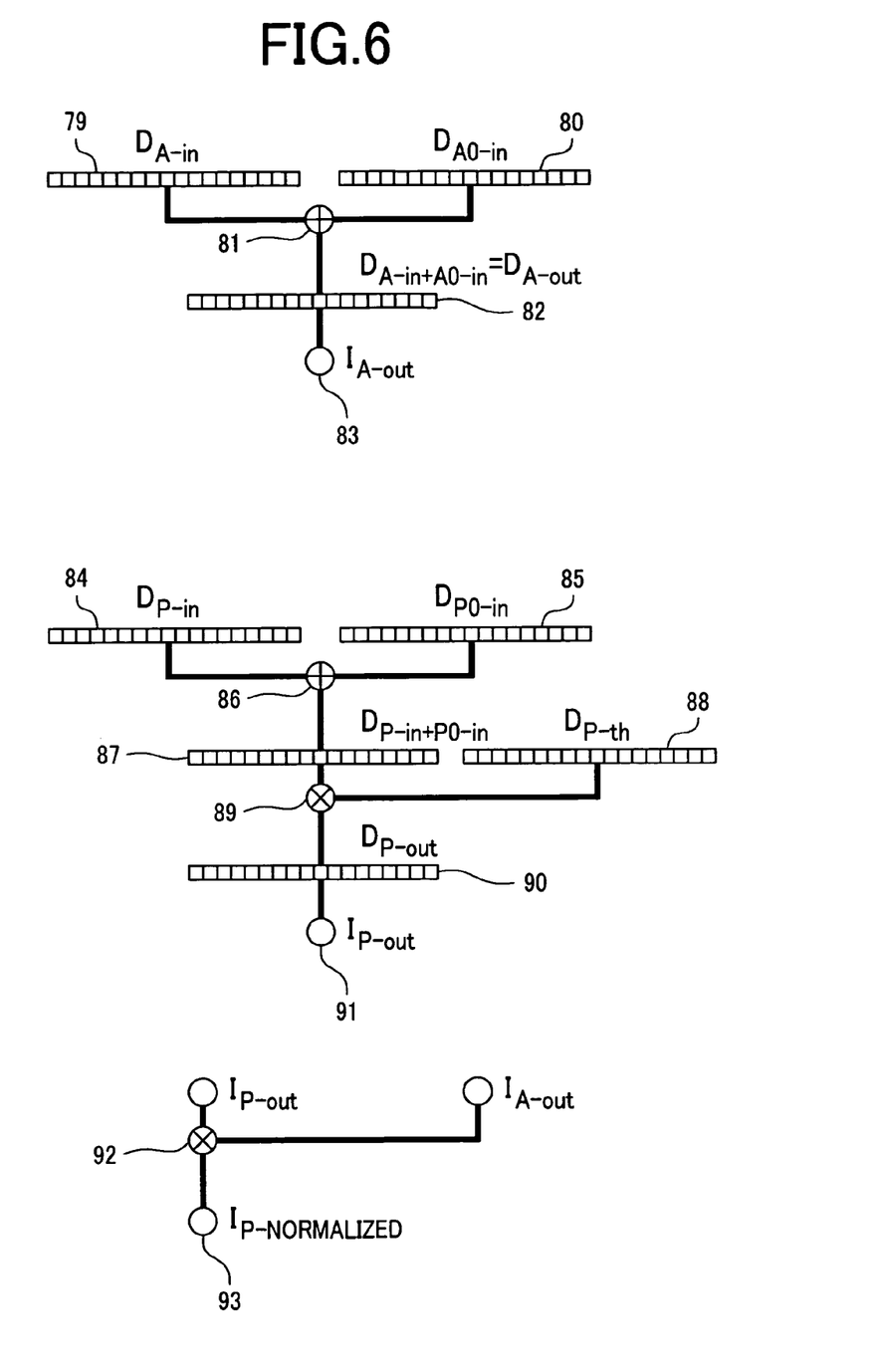
FIG. 6 is a diagram explaining a detection principle in the present invention.

Now, procedures of obtaining both the amplitude image and the phase image simultaneously after setting detection of the interference fringes to be under the optimum conditions in this way will be explained using FIG. 6. Note that, in FIG. 6, a rectangular pattern that is hatched is a conceptual image of a digital output signal. First, for the amplitude image, an output signal by the asymmetric 2-dimensional detector with integration capability is obtained in the absence of specimen or under a condition that both of the two spots splitted by the electron biprism pass through a vacuum on the plane of specimen and stored in the storage means, which is designated as $D_{A-in}$ 80. Next, under a condition that one of the spots transmits through the specimen and the other passes through a vacuum, an output signal $D_{A-in}$ 79 of the asymmetric 2-dimensional detector with integration capability is obtained. The two output signals are added by an adder 81 to obtain an output signal, which is designated as $D_{A-n+A0-in}$ 82.

Further, this is integrated for all the pixels to obtain an output signal, which is designated as $I_{A-out}$ 83. This output signal $I_{A-OUT}$ 83 is equivalent to an amplitude image of a normal electron microscope. In this embodiment, in parallel to the acquisition of the amplitude image, a phase image is obtained simultaneously using another asymmetric 2-dimensional detector with integration capability. That is, under conditions that there is no specimen or the two spots splitted by the electron biprism both pass through a vacuum on the plane of specimen as in the case of the acquisition of the amplitude image, an output signal of the asymmetric 2-dimensional detector with integration capability is obtained and recorded as $D_{P0-in}$ 85.

Next, under conditions that one of the spots transmits through the specimen and the other spot passes through a vacuum, an output signal $D_{P-in}$ 84 of the asymmetric 2-dimensional detector with integration capability is acquired, and the two signals are added by an adder 86 to obtain a 1-dimensional image $D_{P-in+P0-in}$ 87. Using a processor 89 which keeps values equal to or larger than a certain threshold of the pixels among the pixels constituting the 1-dimensional image $D_{P-in+P0+in}$ 87 and sets the values of other pixels to zero, a 1-dimensional image $D_{P-OUT}$ 90 composed of values of the pixels each having a value equal to or larger than the certain threshold is obtained. Here, for the threshold, a 1-dimensional image $D_{P-TH}$ 88 that is set arbitrarily by the user may be used. Alternatively, a 1-dimensional image $D_{P-TH}$ 88 each of whose pixels has an average value of the output signal $I_{A-OUT}$ 83 of the amplitude image. Each pixel value of the 1-dimensional image $D_{P-OUT}$ 90 thus set up is integrated over all the pixels to obtain an output signal, which is designated as $I_{P-OUT}$ 91. The two kinds of output signals $I_{A-OUT}$ 83 and $I_{P-OUT}$ 91 obtained in the above may be displayed, as they are, as the amplitude image and the phase image on the screen, respectively. Alternatively, as shown in the bottom of FIG. 6, another signal $I_{P-NORMALIZED}$ 92 may be generated from the two signals and displayed as a new phase image. Here, a computing equation used to covert the signal is given by the following expression.

$$I_{P-NORMALIZED}=(I_{P-OUT}-I_{A-OUT})/I_{A-OUT}$$

This signal $I_{P-NORMALIZED}$ 92 becomes an output signal of the image corresponding to the cosine of a phase. Naturally, the output signal may be further converted to obtain an output signal of an image that corresponds to a value of the phase. Incidentally, the storage device, the adder 86, and the processor 89 correspond to the storage device 26, the CPU 25, and the signal processor 32, respectively, in the configuration of the STEM shown in FIG. 1.

Figure 7:
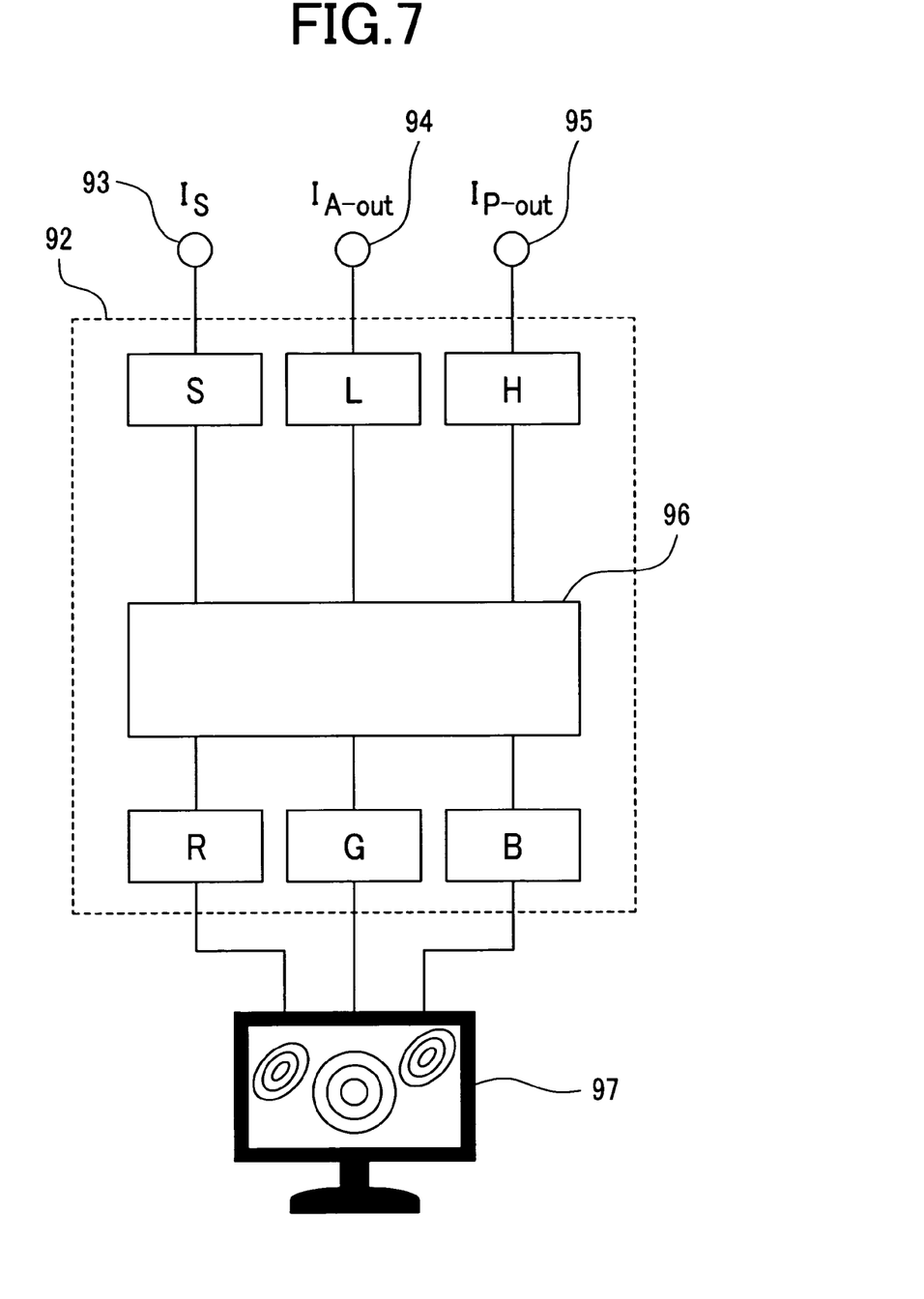
FIG. 7 is a diagram explaining a display method in the present invention.

In this way, in this embodiment, the amplitude image and the phase image can be acquired simultaneously. In order to display the two images simultaneously, the two may be displayed independently on the screen of the display. Alternatively, a signal $I_{A-OUT}$ 94 of the amplitude is brought into correspondence with a Lightness value, as shown in FIG. 7, a signal $I_{P-OUT}$ 95 corresponding to the cosine of a phase or a signal obtained by further converting it into a phase value is brought into correspondence with a Hue value of the HLS color model, and this is converted to the RGB model with a converter 96 to be displayed in a display 97. Thus, the phase image and amplitude image are simultaneously displayed, overlaying one image on the other in the same display. The simultaneous display of the two images makes possible for the user to observe both a structure which is recognizable from the amplitude image and a potential distribution or a magnetic field distribution of the sample which is recognizable from the phase image, thereby making it easy to observe the both images being correlated with each other.

Second Embodiment

Figure 8A:
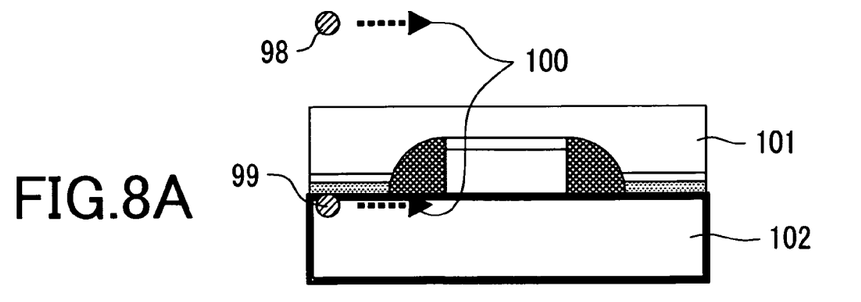
FIG. 8A is a diagram explaining a step of one embodiment of semiconductor dopant profile observation in the present invention.
Figure 8B:
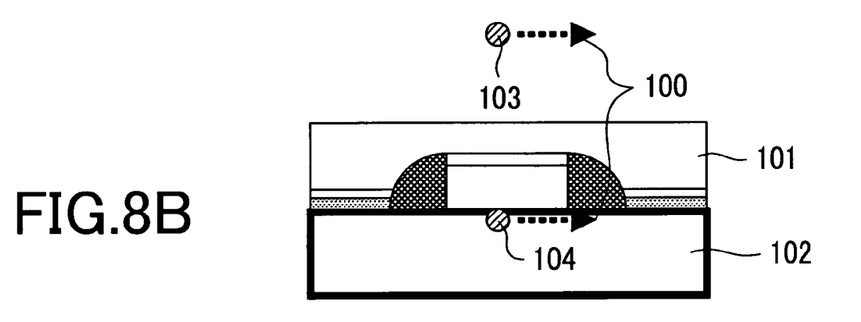
FIG. 8B is a diagram explaining a step of the one embodiment of semiconductor dopant profile observation in the present invention.
Figure 8C:
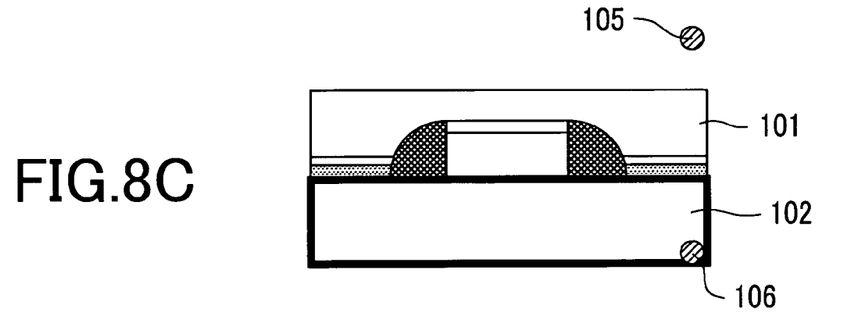
FIG. 8C is a diagram explaining a step of the one embodiment of semiconductor dopant profile observation in the present invention.
Figure 8D:
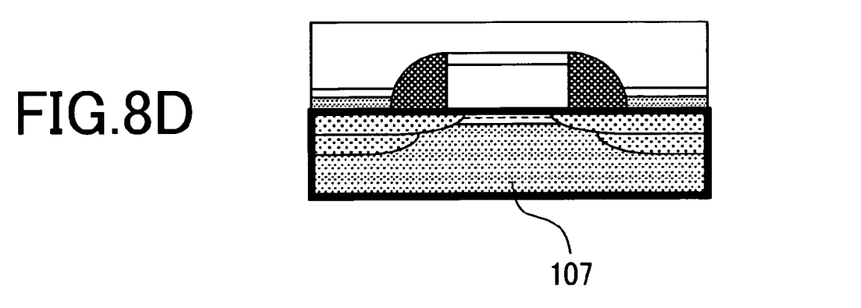
FIG. 8D is a diagram explaining a step of the one embodiment of semiconductor dopant profile observation in the present invention.

FIGS. 8A to 8D show another example of this embodiment. In this example, this embodiment is applied to dopant profile evaluation of a semi-conductor transistor. First, a voltage is applied to the electron biprism in the absence of specimen, the interference fringes magnified with an imaging lens is made to be incident on the asymmetric 2-dimensional detector with integration capability. After that, the electron beams are deflected with a deflection coil, and thereby the electron beams take an arrangement as shown in FIG. 8A. Here, one of two splitted electron beam spots 98, 99 is adjusted to pass through a vacuum and the other is adjusted to transmit through the specimen. Next, the two splitted electron beam spots are scanned in a direction of scanning 100, and at each predetermined scanning distance, the interference fringes are acquired. FIG. 8B shows a comparative relation between the specimen and the electron beam spot at the time when the electron beam is scanned as far as the central portion of a semiconductor thin film specimen. Further the scanning is continued so as to complete the scanning of the electron beam as far as a desired range (FIG. 8C), and subsequently an image corresponding to a dopant profile in an area 107 can be obtained from an image which corresponds to sequentially acquired cosine values of phases of the electron beam or values obtained by converting them into phases.

Third Embodiment

Figure 9A:
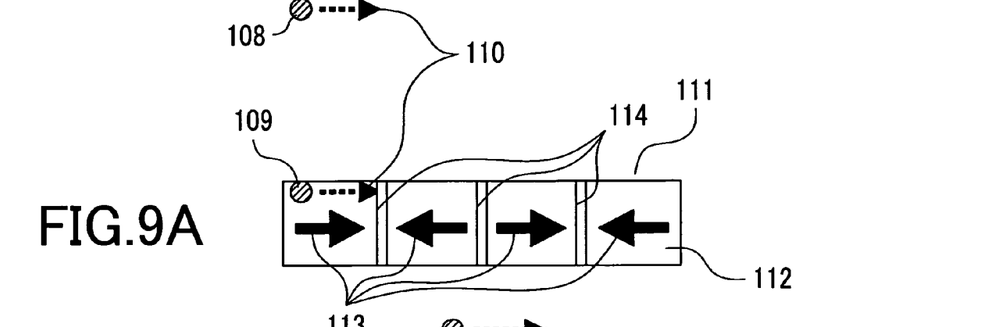
FIG. 9A is a diagram explaining a step of one embodiment of magnetic domain observation in a magnetic thin film in the present invention.

FIGS. 9A to 9D show further another example of the embodiment. In this, the STEM is applied to magnetic domain structure evaluation of a magnetic thin film. First, in the absence of specimen, a voltage is applied to the electron biprism and interference fringes magnified with an imaging lens are made to be incident on the asymmetric 2-dimensional detector with integration capability. After that, by deflecting the electron beam with a deflection coil, the electron beams take an arrangement as shown in FIG. 9A. Here, two splitted electron beam spots 108, 109 are so adjusted that one of them passes through a vacuum in proximity to the specimen and the other transmits through the specimen.

Figure 9B:
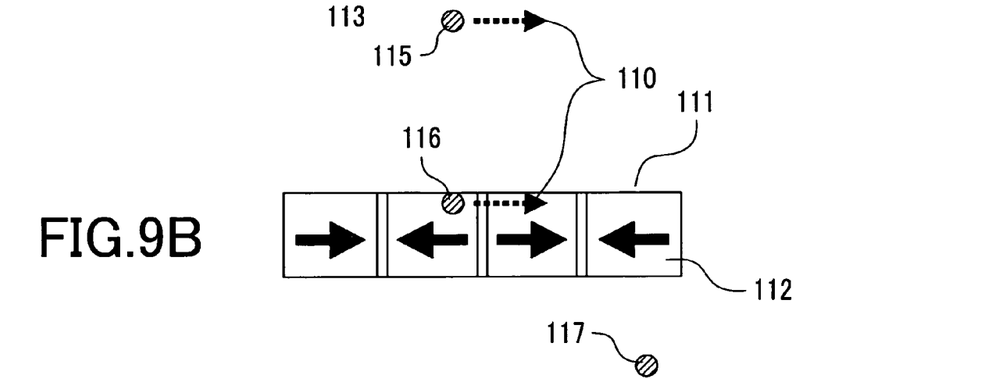
FIG. 9B is a diagram explaining a step of the one embodiment of magnetic domain observation in the magnetic thin film in the present invention.
Figure 9C:
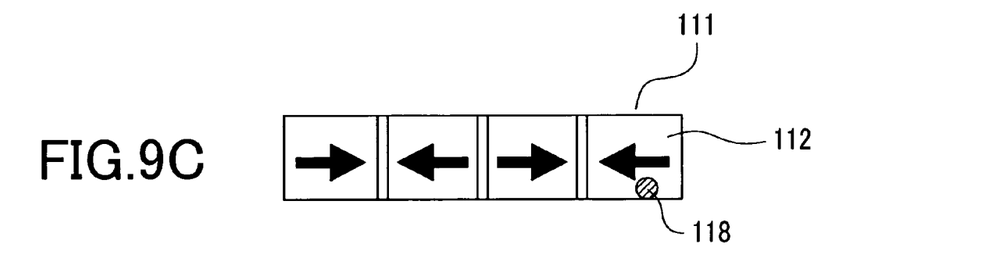
FIG. 9C is a diagram explaining a step of the one embodiment of magnetic domain observation in the magnetic thin film in the present invention.
Figure 9D:
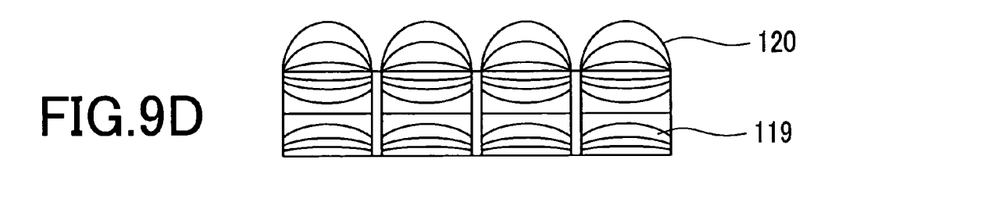
FIG. 9D is a diagram explaining a step of the one embodiment of magnetic domain observation in the magnetic thin film in the present invention.

Next, while the two splitted electron beam spots are being scanned in a direction of scanning 110, the interference fringes are acquired at each predetermined scanning distance. FIG. 9B shows a comparative relation between the specimen and an electron beam spot at a time when the electron beam is scanned as far as the central part of a semiconductor thin film specimen. Further the scanning is continued so as to complete the scanning of the electron beam as far as a desired range (FIG. 9C), and subsequently contour line displays 119, 120 which correspond to a magnetic domain structure 113 in a magnetic thin film 112 and a stray magnetic field in a vacuum 111 in proximity to the specimen can be obtained. Note that, in this embodiment, the apparatus outputs cosine values of phases rather than values obtained by converting the cosine values of phases into phases, whereby a display corresponding to magnetic lines of force can be obtained directly.

The present invention relates to a scanning interference electron microscope used for evaluation of electric and magnetic characteristics of a micro domain.

What is claimed is:

1. A scanning interference electron microscope, comprising:
   a specimen stage;
   an electron optical system for illuminating an electron beam on a specimen placed and held on the specimen stage; and an imaging system for detecting electrons generated from the specimen by the scanning, wherein the electron optical system has an electron gun, means for splitting an electron beam generated by the electron gun into two optical paths, means for scanning one of the electron beams whose optical paths were splitted onto the specimen, and the imaging system has one pair of asymmetric two-dimensional detectors with integration capability for detecting interference fringes of the electron beam having transmitted through the specimen by the electron beam scanning and the electron beam having passed through other electron optical axis, and one of the asymmetric two-dimensional detectors is a detector for phase detection and the other asymmetric two-dimensional detector is a detector for amplitude detection.

2. A scanning interference microscope, comprising:

a specimen stage;

means for scanning an electron beam on a specimen placed and held on the top of the specimen stage;

means for generating interference fringes for an electron beam having transmitted through the specimen; and one pair of asymmetric two-dimensional detectors with integration capability for detecting the interference fringes, wherein one of the asymmetric two-dimensional detectors is a detector for phase detection and the other asymmetric two-dimensional detector is a detector for amplitude detection.

3. The scanning interference electron microscope according to claim 1, wherein the asymmetric two-dimensional detector with integration capability is comprised of a plurality of electron beam sensing elements and outputs a one-dimensional interference-fringe image signal whose each pixel has a value equal to a value obtained by integrating the interference fringes in a direction parallel to the interference fringes.

4. The scanning interference electron microscope according to claim 2, wherein the asymmetric two-dimensional detector with integration capability is comprised of a plurality of electron beam sensing elements and outputs a one-dimensional interference-fringe image signal whose each pixel has a value equal to a value obtained by integrating the interference fringes in a direction parallel to the interference fringes.

5. The scanning interference electron microscope according to claim 1, comprising:

driving means for driving a specimen stage and control means for controlling the stage driving means, wherein the control means controls the specimen stage driving means so that an optical path of one electron beam which is different from the other electron beam being scanned onto the specimen passes through a position which does not give rise to transmission through the specimen.

6. The scanning interference electron microscope according to claim 2, comprising driving means for driving a specimen stage and control means for controlling the stage driving means, wherein the control means controls the specimen stage driving means so that an optical path of one electron beam which is different from the other electron beam being scanned onto the specimen passes through a position which does not give rise to transmission through the specimen.

7. The scanning interference electron microscope according to claim 1,

Wherein the asymmetric two-dimensional detector with integration capability is rotationable in a two-dimensional plane.

8. The scanning interference electron microscope according to claim 7, comprising means for adjusting conditions of forming the interference fringes on the detector.

9. The scanning interference electron microscope according to claim 3, comprising:

storage means which maintains a first one-dimensional interference-fringe image signal obtained when both of the two splitted electron beams pass through a vacuum region and a second one-dimensional interference-fringe image signal obtained when one of the two splitted electron beams transmits through the specimen and the other electron beam passes through a vacuum region; and a signal processor which calculates the amount of phase shift generated when the electron beam transmits through the specimen and the amount of amplitude of the electron beam having transmitted through the specimen from the first one-dimensional interference-fringe image signal and the second one-dimensional interference-fringe image signal.

10. The scanning interference electron microscope according to claim 9, wherein the signal processor calculates the amount of amplitude of the electron beam having transmitted through the specimen by performing calculation which adds the first one-dimensional interference-fringe image signal and the second one-dimensional interference-fringe image signal for each pixel of the asymmetric two-dimensional detector with integration capability.

11. The scanning interference electron microscope according to claim 9, wherein the signal processor performs a calculation which compares the second one-dimensional interference-fringe image signal with the first one-dimensional interference-fringe image signal for each pixel of the asymmetric two-dimensional detector with integration capability, retains values of pixels each having a value equal to or more than a fixed threshold, and sets values of other pixels to zero, performs a calculation which integrates the second one-dimensional interference-fringe image signals subjected to the above-mentioned calculation over the entire pixels of the asymmetric two-dimensional detector with integration capability, normalizes a value obtained by the above-mentioned calculation with a predetermined value, and obtains the amount of phase shift from an arc cosine of the normalized value.

12. The scanning interference electron microscope according to claim 9, wherein the signal processor performs a calculation which brings signals corresponding to cosines of the phases or signals obtained by converting the cosines of the phases into phase values, ranging from a minimum to a maximum, into correspondence with Hue values of the HLS color model ranging from zero to unity, and a calculation which brings the amplitude data ranging from a minimum to a maximum into correspondence with Lightness values in the HLS color model ranging from zero to unity, and the display means displays the phase data and amplitude data so processed, overlaying one signal on the other.

13. The scanning interference electron microscope according to claim 4, comprising:

storage means which maintains a first 1-dimensional interference-fringe image signal obtained when both of the two splitted electron beams pass through a vacuum region and a second one-dimensional interference-fringe image signal obtained when one of the two splitted electron beams transmits through the specimen and the other electron beam passes through a vacuum region; and a signal processor which calculates the amount of phase shift generated when the electron beam transmits through the specimen and the amount of amplitude of the electron beam having transmitted through the specimen from the first 1-dimensional interference-fringe image signal and the second one-dimensional interference-fringe image signal.

14. The scanning interference electron microscope according to claim 13, wherein the signal processor calculates the amount of amplitude of the electron beam having transmitted through the specimen by performing calculation which adds the first one-dimensional interference-fringe image signal and the second one-dimensional interference-fringe image signal for each pixel of the asymmetric two-dimensional detector with integration capability.

15. The scanning interference electron microscope according to claim 13, wherein the signal processor performs a calculation which compares the second 1-dimensional interference-fringe image signal with the first one-dimensional interference-fringe image signal for each pixel of the asymmetric two-dimensional detector with integration capability, retains values of pixels each having a value equal to or more than a fixed threshold, and sets values of other pixels to zero, performs a calculation which integrates the second one-dimensional interference-fringe image signals subjected to the above-mentioned calculation over the entire pixels of the asymmetric two-dimensional detector with integration capability, normalizes a value obtained by the above-mentioned calculation with a predetermined value, and obtains the amount of phase shift from an arc cosine of the normalized value.

16. The scanning interference electron microscope according to claim 13, wherein the signal processor performs a calculation which brings signals corresponding to cosines of the phases or signals obtained by converting the cosines of the phases into phase values, ranging from a minimum to a maximum, into correspondence with Hue values of the HLS color model ranging from zero to unity, and a calculation which brings the amplitude data ranging from a minimum to a maximum into correspondence with Lightness values in the HLS color model ranging from zero to unity, and the display means displays the phase data and amplitude data so processed, overlaying one signal on the other.

* * * * *